United States Patent
Kataoka et al.

(10) Patent No.: US 9,509,334 B2
(45) Date of Patent: Nov. 29, 2016

(54) NON-TRANSITORY COMPUTER-READABLE RECORDING MEDIUM, COMPRESSION METHOD, DECOMPRESSION METHOD, COMPRESSION DEVICE AND DECOMPRESSION DEVICE

(71) Applicant: FUJITSU LIMITED, Kawasaki-shi, Kanagawa (JP)

(72) Inventors: Masahiro Kataoka, Kamakura (JP); Yasuhiro Suzuki, Yokohama (JP); Ryo Matsumura, Numazu (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/010,638

(22) Filed: Jan. 29, 2016

(65) Prior Publication Data

US 2016/0226511 A1    Aug. 4, 2016

(30) Foreign Application Priority Data

Jan. 30, 2015 (JP) .................... 2015-017716

(51) Int. Cl.
*H03M 7/30* (2006.01)

(52) U.S. Cl.
CPC .................... *H03M 7/30* (2013.01)

(58) Field of Classification Search
CPC .......... H03M 7/00; H03M 7/30; H03M 7/40; H03M 7/48; H03M 7/3086; H03M 7/3088
USPC ...................................... 341/51–90
See application file for complete search history.

(56) References Cited

U.S. PATENT DOCUMENTS

| 5,204,756 A | * | 4/1993 | Chevion | H04N 1/411 358/2.1 |
| 5,389,995 A | * | 2/1995 | Uchiyama | G02B 7/32 396/101 |
| 5,442,350 A | | 8/1995 | Iyer et al. | |
| 5,467,087 A | * | 11/1995 | Chu | H03M 7/3086 341/51 |

(Continued)

FOREIGN PATENT DOCUMENTS

| EP | 0 788 239 A2 | 8/1997 |
| JP | 6-222903 | 8/1994 |

(Continued)

OTHER PUBLICATIONS

Extended European Search Report mailed Jul. 5, 2016, for EP 16153348.4.

*Primary Examiner* — Lam T Mai
(74) *Attorney, Agent, or Firm* — Oblon, McClelland, Maier & Neustadt, L.L.P.

(57) ABSTRACT

An information processing apparatus according to an embodiment determines whether a target character string is registered in a first dictionary, the target character string being a compression target contained in input data, outputs a compression code corresponding to the target character string when the target string is registered in the first dictionary, searches the target character string in first data when the target character string is not registered in the first dictionary, the first date accumulating character strings that are a part of the input data and have been determined to be not registered in the first dictionary, registers a matched character string in a second dictionary different from the first dictionary when the target character string is searched in the first data and outputs a compression code corresponding to a registration number of the target character string in the second dictionary.

12 Claims, 16 Drawing Sheets

(56) References Cited

U.S. PATENT DOCUMENTS

| | | | |
|---|---|---|---|
| 5,870,036 A | 2/1999 | Franaszek et al. | |
| 6,985,965 B2* | 1/2006 | Hannu | H03M 7/30 709/247 |
| 7,136,803 B2* | 11/2006 | Kida | G06F 17/2863 704/10 |
| 7,221,291 B2* | 5/2007 | Hirose | H03M 7/3086 341/50 |
| 7,308,508 B1* | 12/2007 | Dewa | G06F 17/3061 348/E7.054 |
| 2002/0059462 A1 | 5/2002 | Hannu et al. | |
| 2007/0061131 A1* | 3/2007 | Kida | G06F 17/2863 704/10 |
| 2009/0274294 A1* | 11/2009 | Itani | H03M 7/30 380/28 |
| 2009/0324110 A1* | 12/2009 | Fujinuki | H04N 19/30 382/232 |
| 2013/0181851 A1* | 7/2013 | Kataoka | H03M 5/02 341/52 |
| 2014/0188893 A1* | 7/2014 | Kobayashi | G06F 17/3033 707/747 |
| 2015/0188565 A1* | 7/2015 | Kataoka | H03M 7/3084 341/87 |

FOREIGN PATENT DOCUMENTS

| | | |
|---|---|---|
| JP | 8-288861 | 11/1996 |
| JP | 2004-514366 | 5/2004 |
| WO | WO 02/41497 A2 | 5/2002 |

* cited by examiner

DYNAMIC DICTIONARY PORTION  A3

| 0 | 1 | 2 | 3 | 4 | 5 | 6 | 7 | 8 | 9 | 10 | 11 | 12 | 13 | ... |
|---|---|---|---|---|---|---|---|---|---|----|----|----|----|-----|
| . | . | . | . | . | K | a | t | a | o | k  | a  | △  | .  | ... |

T1

| REGISTRATION NUMBER | STORAGE POSITION | DATA LENGTH |
|---|---|---|
| 0000 0000 | 0000 0000 0000 | 0101 |
| 0000 0001 | 0000 0000 0101 | 1000 |
| ... | ... | ... | d2

| IDENTIFIER | REGISTRATION NUMBER |
|---|---|
| 1 | 0000 0001 |

FIG.8
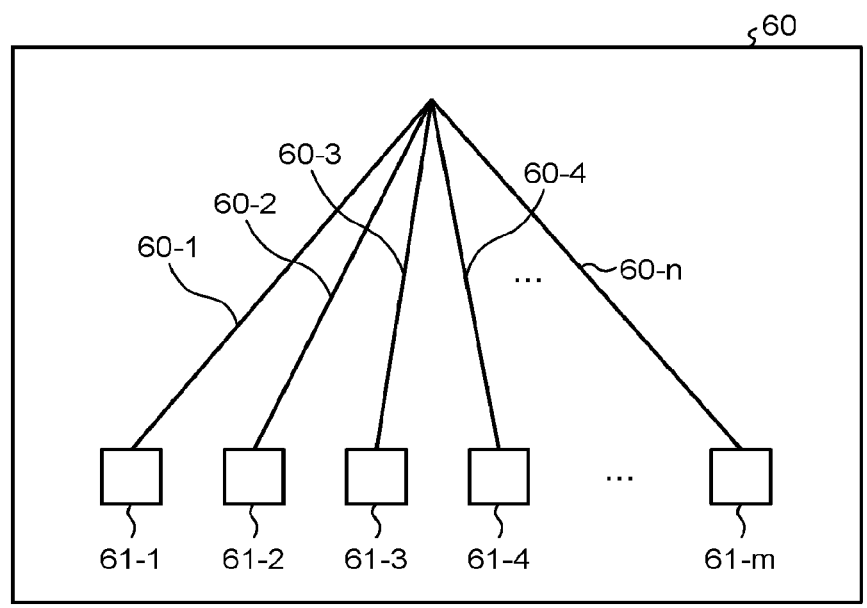
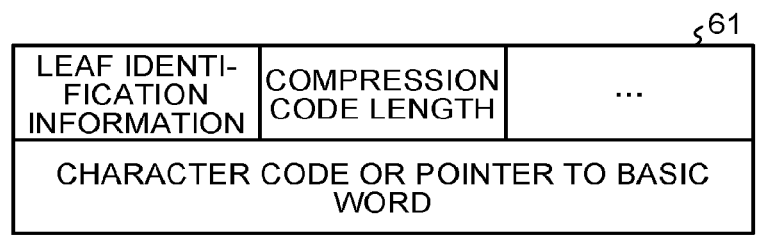

NON-TRANSITORY COMPUTER-READABLE RECORDING MEDIUM, COMPRESSION METHOD, DECOMPRESSION METHOD, COMPRESSION DEVICE AND DECOMPRESSION DEVICE

CROSS-REFERENCE TO RELATED APPLICATION(S)

This application is based upon and claims the benefit of priority of the prior Japanese Patent Application No. 2015-017716, filed on Jan. 30, 2015, the entire contents of which are incorporated herein by reference.

FIELD

The embodiments discussed herein are related to an encoding program and the like.

BACKGROUND

In recent years, there have been conventional techniques of encoding a compression target file using a static dictionary. The static dictionary is a dictionary in which appearance frequencies of words and characters appearing in a document are specified based on common English-language dictionaries, Japanese-language dictionaries, textbooks, and the like, and shorter compression codes are assigned to words having higher appearance frequencies. In the conventional techniques, compression processing is performed based on the static dictionary by converting text in a compression target file into the compression codes assigned to the words and the characters in the static dictionary, so as to form a compressed file.

For example, Japanese Laid-open Patent Publication No. 08-288861, Japanese National Publication of International Patent Application No. 2004-514366, and Japanese Laid-open Patent Publication No. 06-222903 disclose the conventional techniques.

With the above-mentioned conventional techniques, however, lengths of compression codes assigned to words that are not registered in the static dictionary increase in data of the compressed file, which lowers a compression rate thereof.

For example, in the static dictionary that is used in the conventional techniques, words including personal names, names of places, and work names are not registered. The compression processing is therefore performed by separating these words into characters forming the words and converting them to compression codes assigned to the respective characters. In this case, a compression rate of a compression target file is lowered.

SUMMARY

According to an aspect of an embodiment, a non-transitory computer-readable recording medium stores therein an encoding program that causes a computer to execute a process including determining whether a target character string is registered in a first dictionary, the target character string being a compression target contained in input data, the first dictionary correlating compression codes and corresponding strings; outputting a compression code corresponding to the target character string when the target string is registered in the first dictionary; searching the target character string in first data when the target character string is not registered in the first dictionary, the first date accumulating character strings that are a part of the input data and have been determined to be not registered in the first dictionary; registering a matched character string in a second dictionary different from the first dictionary when the target character string is searched in the first data; and outputting a compression code corresponding to a registration number of the target character string in the second dictionary.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a view illustrating an example of a data structure of a nodeless tree for decompression;

DESCRIPTION OF EMBODIMENTS

Preferred embodiments of the present invention will be explained with reference to accompanying drawings. The embodiments do not limit the invention.

Figure 1:
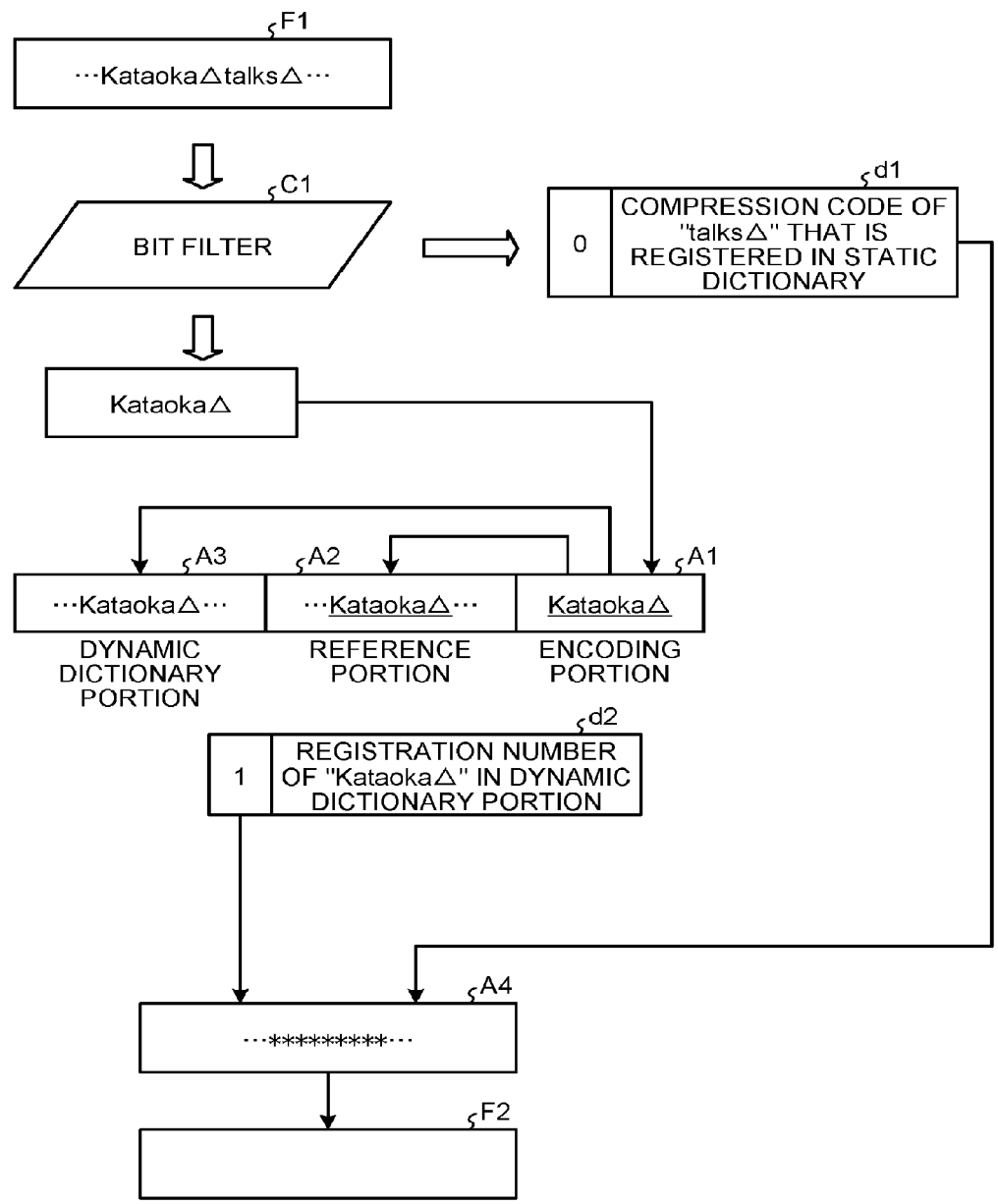
FIG. 1 is a first view illustrating an example of flow of compression processing of an information processing apparatus according to an embodiment.

FIG. 1 is an example of flow of compression processing of an information processing apparatus according to an embodiment. In the information processing apparatus, a storage region A1, a storage region A2, a storage region A3, and a storage region A4 as work areas for the compression processing are provided in a memory. In the following description, the storage region A1, the storage region A2, and the storage region A3 are referred to as an encoding portion, a reference portion, and a dynamic dictionary portion, respectively.

The information processing apparatus reads a file F1 that is a compression target, and extracts from text in the file F1, as words, character strings that each begin with a head character and are delimited by a terminal symbol in the file F1. For example, the file F1 contains data of " . . . KataokaΔtalksΔ . . . ". Words of "KataokaΔ", "talksΔ", and the like are contained. The terminal symbol is a symbol of a space (blank), a comma (,), or a dot (.). In the embodiment, the terminal symbol is expressed by "Δ (triangle)", as an example.

The information processing apparatus compares a bit filter C1 and a character string and determines whether the character string hits the bit filter C1. The bit filter is a filter for specifying a character string of a word that is compressed using a static dictionary. When the character string hits the bit filter C1, the information processing apparatus converts the character string into a compression code corresponding to the character string of the word based on the static dictionary and outputs compressed data. On the other hand, when the character string does not hit the static dictionary of the bit filter C1, the information processing apparatus converts the character string into a compression code corresponding to the character string of the word that is registered in a dynamic dictionary and outputs compressed data.

The static dictionary is a dictionary in which appearance frequencies of words and characters appearing in a document are specified based on common English-language dictionaries, Japanese-language dictionaries, textbooks, and the like, and shorter compression codes are assigned to words and characters having higher appearance frequencies.

The dynamic dictionary causes the character string that does not hit the bit filter C1 to be stored in the encoding portion on a slide window and to be checked against accumulated character strings in the reference portion. A matched character string is registered in the dynamic dictionary and a registration number thereof is assigned as the compression code. The dynamic dictionary will be described in detail later.

Processing when the information processing apparatus generates compressed data of the character string "talksΔ" of the word in the file F1 that is the compression target is described. It is assumed that the character string "talksΔ" of the word hits the bit filter C1.

The information processing apparatus compares the character string "talksΔ" of the word and the bit filter C1 and determines whether the character string "talksΔ" of the word hits the bit filter C1. The information processing apparatus encodes the character string "talksΔ" of the word to a compression code that is registered in the static dictionary because the character string "talksΔ" of the word hits the bit filter C1. The information processing apparatus generates compressed data d1 containing an identifier "0" and the compression code of the character string "talksΔ" of the word. The identifier "0" is information indicating that the character string has been encoded based on the static dictionary. The information processing apparatus writes the compressed data d1 into the storage region A4.

Then, processing when the information processing apparatus generates compressed data of the character string "KataokaΔ" of the word in the file F1 that is the compression target is described. It is assumed that the character string "KataokaΔ" does not hit the bit filter C1.

The information processing apparatus compares the character string "KataokaΔ" of the word and the bit filter C1 and determines whether the character string "KataokaΔ" of the word hits the bit filter C1. The information processing apparatus executes the following processing because the character string "KataokaΔ" of the word does not hit the bit filter C1.

The information processing apparatus stores the character string "KataokaΔ" of the word in the storage region A1 and compares character strings of words stored in the storage region A2 and the character string of the word stored in the storage region A1, so as to search for a "matching word". The "matching word" is a word stored in the storage region A2 that matches with the character string of the word stored in the storage region A1. For example, when the character string " . . . KataokaΔ . . . " has been already stored in the storage region A2, the matching word is "KataokaΔ". The information processing apparatus searches the storage region A2 for "K" and checks sequentially whether "a", "t", "a", "o", "k", "a", and "Δ" are continuous in this order while being subsequent to a position of "K" in the storage region A2 that has been located by the search.

When the length of the matching word is equal to or larger than a predetermined length Lmin, the information processing apparatus registers the matching word "KataokaΔ" in the storage region A3 of the dynamic dictionary portion. The information processing apparatus generates a compression code based on registration contents in the dynamic dictionary portion. That is to say, the information processing apparatus specifies a registration number of the matching word registered in the dynamic dictionary portion as the compression code of the character string "KataokaΔ". The information processing apparatus generates compressed data d2 containing an identifier "1" and the compression code of the character string "KataokaΔ" of the word. The identifier "1" is information indicating that the character string has been encoded based on the dynamic dictionary. The information processing apparatus writes the compressed data d2 into the storage region A4. The information processing apparatus adds the character string stored in the storage region A1 to the storage region A2, so as to update the storage region A2.

The storage region A2 is a data region the data size of which is defined. For example, the storage region A2 is a storage region of approximately several kilobytes to several tens kilobytes (for example, 64 Kbytes). When data having equal to or larger than a data size defined for the storage region A2 is stored, the information processing apparatus stores new data over old data stored in the head of the storage region A2. A relative address of the data stored in the storage region A2 from a writing position that is updated with the storage of the data indicates a head position.

The storage region A3 is a storage region the data size of which is defined in accordance with the size of an input file. For example, the storage region A3 is a storage region of approximately several kilobytes to several tens kilobytes (for example, 64 Kbytes). For example, when data having equal to or larger than a data size defined for the storage region A3 is stored, the information processing apparatus inhibits storage of new data.

Figure 2:
FIG. 2 is a view illustrating an example of a dynamic dictionary portion.

FIG. 2 is a view illustrating an example of the dynamic dictionary portion. The dynamic dictionary portion as illustrated in FIG. 2 includes the storage region A3 and a reference table T1. The reference table T1 holds a registration number, a storage position, and a data length in a correspondence manner. In an example as illustrated in FIG. 2, the registration number, the storage position, and the data length are represented in binary. The registration number is information indicating the order at which the matching word has been registered in the storage region A3. In the embodiment, the registration number of data registered first is set to "00000000". The storage position is information indicating the position in the storage region A3 at which a head character of the matching word has been stored. The data length is information indicating the length of the matching word.

For example, when the matching word "KataokaΔ" is the matching word registered second in the storage region A3, the information processing apparatus registers "00000001" for the registration number in the reference table T1 as the registration number corresponding to the matching word "KataokaΔ". The information processing apparatus registers "000000000101" for the storage position because the head character "K" of the matching word "KataokaΔ" is stored at "5" in the storage region A3. The information processing apparatus registers "10000" for the data length because the data length of the matching word "KataokaΔ" is "8".

As illustrated in FIG. 2, when the matching word "KataokaΔ" is registered in the dynamic dictionary portion, the registration number of the matching word "KataokaΔ" is "00000001". In this case, the information processing apparatus sets the compression code of the character string "KataokaΔ" to "00000001". The information processing apparatus generates the compressed data d2 containing the identifier "1" and the registration number "00000001" as the compressed data d2 of the character string "KataokaΔ".

Figure 3:
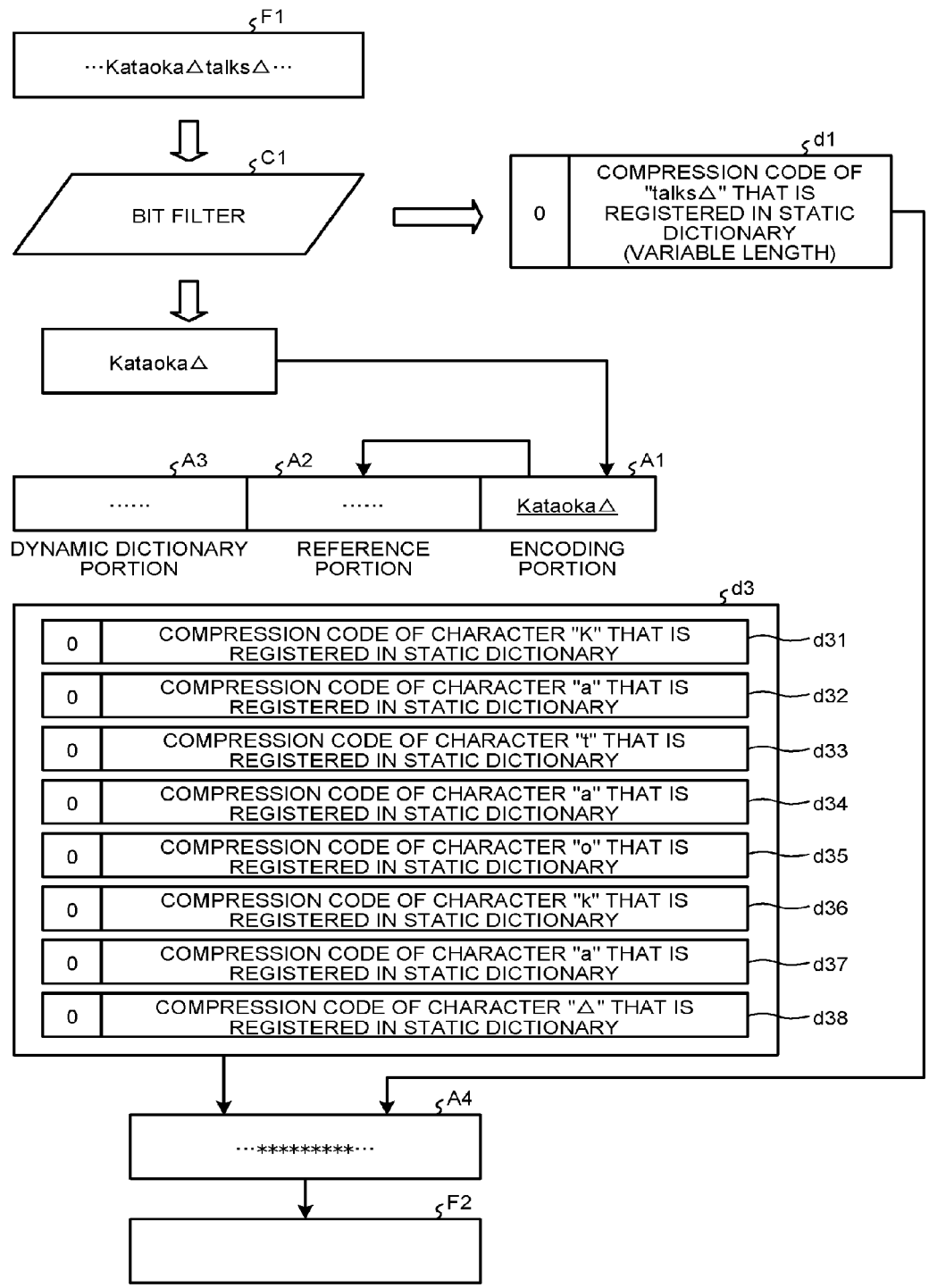
FIG. 3 is a second view illustrating an example of flow of the compression processing of the information processing apparatus in the embodiment.

FIG. 3 is a second view illustrating an example of flow of the compression processing of the information processing apparatus in the embodiment. The information processing apparatus reads the file F1 that is the compression target, and extracts from the file F1 that is the compression target, character strings that each begin with a head character and are delimited by a terminal symbol in the file F1. For example, the file F1 contains data of " . . . KataokaΔtalksΔ . . . ".

Processing when the information processing apparatus generates the compressed data of the character string "talksΔ" of the word in the file F1 that is the compression target is the same as the processing as illustrated in FIG. 1 and explanation thereof is therefore omitted.

Processing when the information processing apparatus generates compressed data of the character string "KataokaΔ" of the word in the file F1 that is the compression target is described. It is assumed that the character string "KataokaΔ" of the word does not hit the bit filter C1.

The information processing apparatus compares the character string "KataokaΔ" of the word and the bit filter C1 and determines whether the character string "KataokaΔ" of the word hits the bit filter C1. The information processing apparatus executes the following processing because the character string "KataokaΔ" of the word does not hit the bit filter C1.

The information processing apparatus stores the character string "KataokaΔ" of the word in the storage region A1 and compares character strings of words stored in a storage region A1 and the character string of the word stored in the storage region A1, so as to search for a "matching word". For example, when the storage region A2 does not store therein "KataokaΔ", the information processing apparatus encodes individual characters of the character string "KataokaΔ" of the word based on the static dictionary. That is to say, the information processing apparatus encodes each of "K", "a", "t", "a", "o", "k", "a", and "Δ" based on the static dictionary, so as to generate compressed data d3. The information processing apparatus writes the compressed data d3 into the storage region A4.

The compressed data d3 has pieces of compressed data d31, d32, d33, d34, d35, d36, d37, and d38. The compressed data d31 has the identifier "0" and a compression code of "K" that is registered in the static dictionary. The compressed data d32 has the identifier "0" and a compression code of "a" that is registered in the static dictionary. The compressed data d33 has the identifier "0" and a compression code of "t" that is registered in the static dictionary. The compressed data d34 has the identifier "0" and the compression code of "a" that is registered in the static dictionary. The compressed data d35 has the identifier "0" and a compression code of "o" that is registered in the static dictionary. The compressed data d36 has the identifier "0" and a compression code of "k" that is registered in the static dictionary. The compressed data d37 has the identifier "0" and the compression code of "a" that is registered in the static dictionary. The compressed data d38 has the identifier "0" and a compression code of "A" that is registered in the static dictionary.

The information processing apparatus stores, in a compressed file F2, the pieces of compressed data stored in the storage region A4.

Figure 4:
FIG. 4 is a view illustrating an example of the block configuration of a compressed file.

FIG. 4 is a view illustrating an example of the block configuration of the compressed file F2. As illustrated in FIG. 4, the compressed file F2 includes a header portion, compressed data, and a trailer portion. The header portion has information identifying a compression algorithm used for generation of the compressed file F2 and information such as parameters used for compression, for example. The compressed data corresponds to the pieces of compressed data generated by the information processing apparatus. The trailer portion has information of the dynamic dictionary portion after the compression processing is completed. Information of the dynamic dictionary portion corresponds to information of the dynamic dictionary portion as illustrated in FIG. 2.

Figure 5:
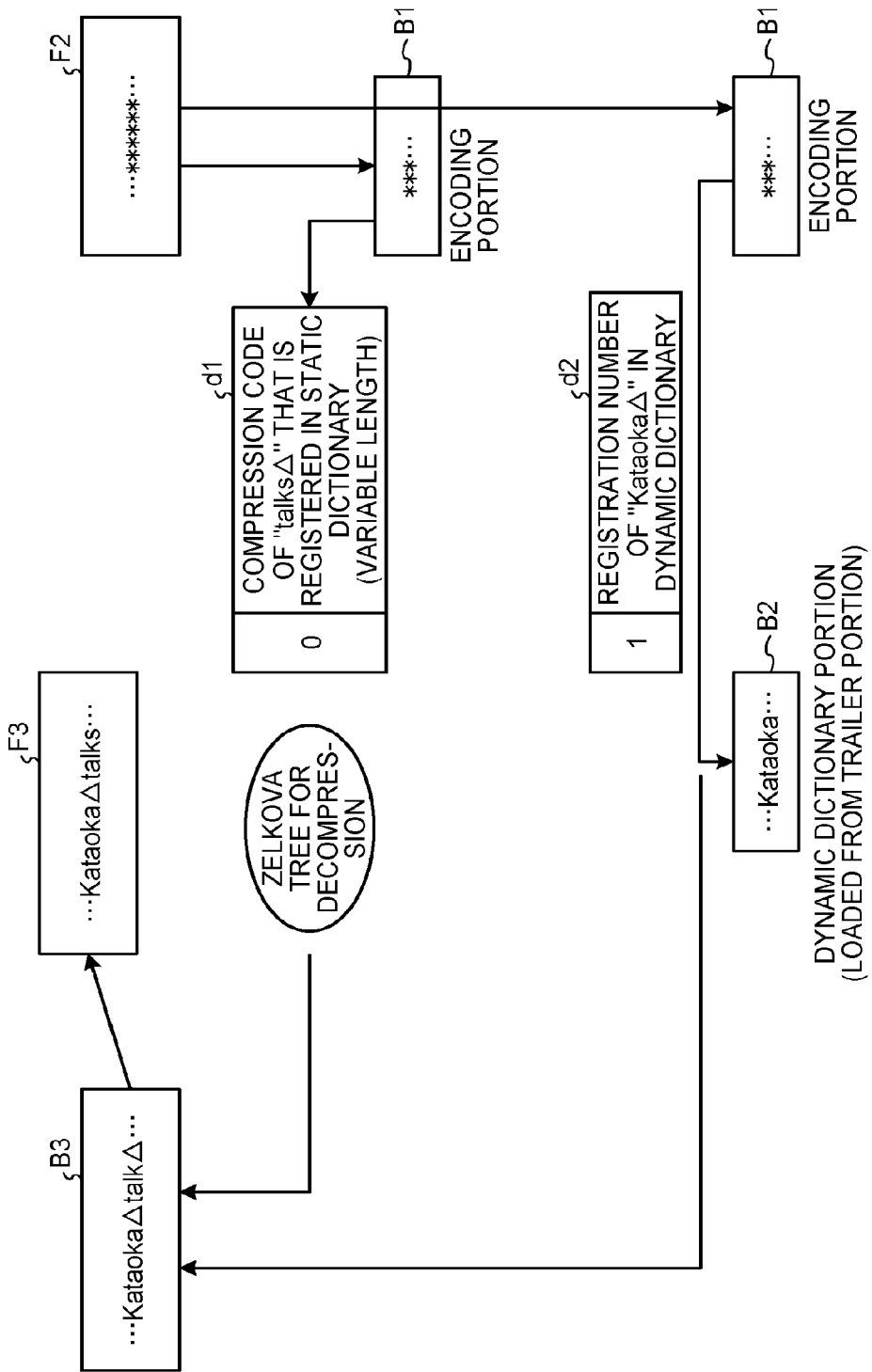
FIG. 5 is a view illustrating an example of flow of decompression processing of the information processing apparatus in the embodiment.

FIG. 5 is a view illustrating an example of flow of decompression processing of the information processing apparatus in the embodiment. In the information processing apparatus, a storage region B1, a storage region B2, and a storage region B3 as work areas for the decompression processing are provided in the memory. The information processing apparatus loads the compressed file F2 on the storage region B1 and sequentially reads the pieces of compressed data. The information processing apparatus generates pieces of decompressed data based on the read pieces of compressed data.

The information processing apparatus performs the generation processing in accordance with the identifiers contained in the pieces of compressed data. The information processing apparatus stores the generated pieces of decompressed data in the storage region B3 and generates a decompressed file F3 based on the pieces of decompressed data stored in the storage region B3. The information processing apparatus loads, on the storage region B2, the information of the dynamic dictionary portion that has been stored in the trailer portion in FIG. 4. In the following description, the storage region B1 is referred to as an encoding portion and the storage region B2 is referred to as a dynamic dictionary portion appropriately. The decompression processing on the pieces of compressed data d1 and d2 as illustrated in FIG. 1 is described.

The information processing apparatus reads the compressed data d1 and determines the identifier of the compressed data d1. When the identifier of the compressed data d1 is "0", the information processing apparatus determines that the compressed data d1 has been encoded based on the static dictionary. The information processing apparatus compares the compressed data d1 and a nodeless tree for decompression and specifies decompressed data that is indicated by the nodeless tree for decompression. The information processing apparatus then writes the decompressed data into the storage region B3.

The information processing apparatus reads the compressed data d2 and determines the identifier of the compressed data d2. When the identifier of the compressed data d2 is "1", the information processing apparatus determines that the compressed data d2 has been encoded based on the dynamic dictionary. The information processing apparatus generates decompressed data based on the compression code in the compressed data d2 with reference to the dynamic dictionary portion.

For example, the information processing apparatus compares the registration number contained in the compressed data d2 and the reference table T1 of the dynamic dictionary portion and specifies the storage position and the data length in the storage region B2. The information processing apparatus reads data corresponding to the storage position and the data length from the storage region B2 and sets the read data to the decompressed data. For example, "Kataoka" is generated as the decompressed data because the registration number in the compressed data d2 indicates "KataokaΔ" in the dynamic dictionary portion.

Figure 6:
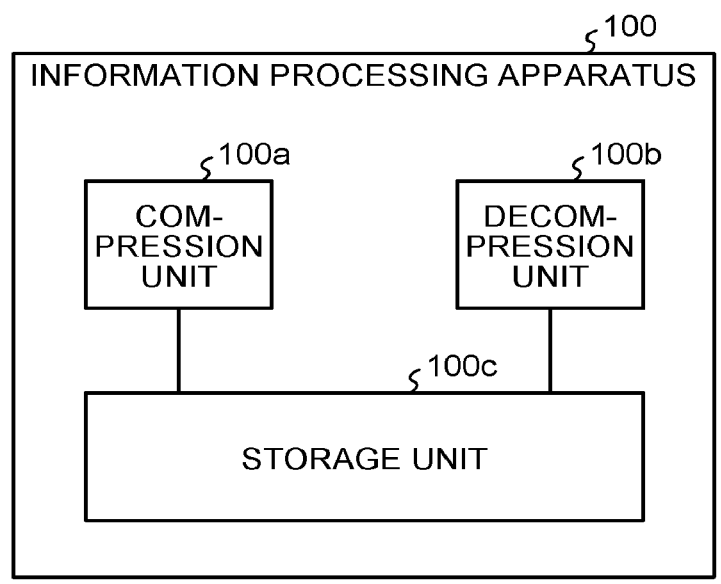
FIG. 6 is a functional block diagram illustrating the configuration of the information processing apparatus in the embodiment.

FIG. 6 is a functional block diagram illustrating the configuration of the information processing apparatus in the embodiment. As illustrated in FIG. 6, an information processing apparatus 100 includes a compression unit 100a, a decompression unit 100b, and a storage unit 100c.

The compression unit 100a is a processor that executes the compression processing as illustrated in FIG. 1 to FIG. 3. The decompression unit 100b is a processor that executes the decompression processing as illustrated in FIG. 5. The storage unit 100c stores therein the file F1 that is the compression target, the compressed file F2 provided by the compression processing, the file F3 provided by decompressing the file F2, and the like.

The information processing apparatus 100 sets the storage regions A1, A2, A3, A4, B1, B2, and B3 as illustrated in FIG. 1, FIG. 5, and the like into the storage unit 100c. The storage unit 100c stores therein a nodeless tree for compression and the nodeless tree for decompression.

Figure 7:
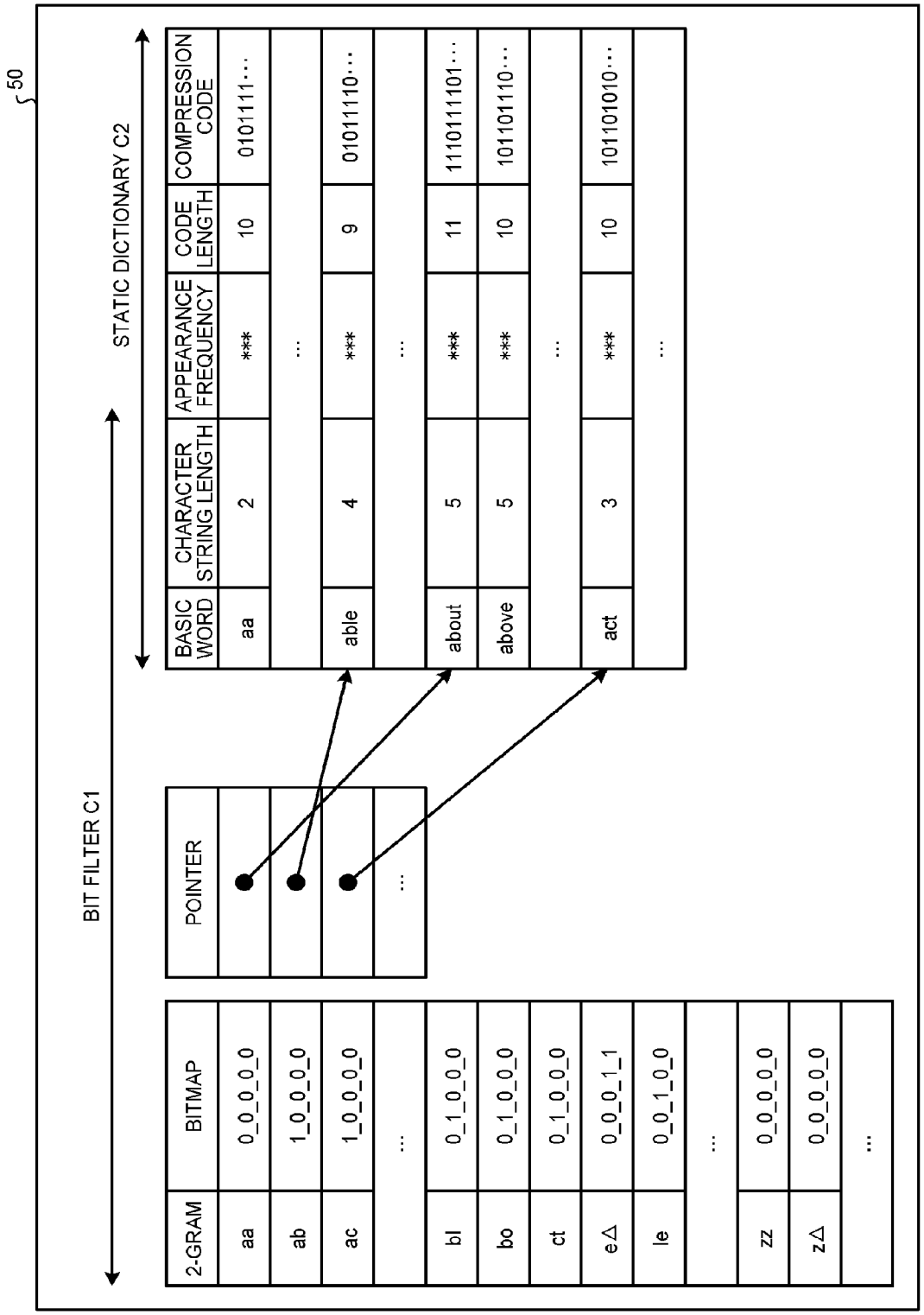
FIG. 7 is a view illustrating an example of a data structure of a nodeless tree for compression.

FIG. 7 is a view illustrating an example of a data structure of the nodeless tree for compression. As illustrated in FIG. 7, a nodeless tree 50 for compression has 2-gram, a bitmap, a pointer, a basic word, a character string length, an appearance frequency, a code length, and a compression code. Among them, the 2-gram, the bitmap, the pointer, the basic word, and the character string length correspond to the bit filter C1. The basic word, the character string length, the appearance frequency, the code length, and the compression code correspond to a static dictionary C2.

The 2-gram is information indicating a character string of two characters. The bitmap indicates a bitmap corresponding to the character string of the 2-gram. For example, a bitmap corresponding to "aa" is "0_0_0_0_0". The pointer is a pointer indicating a position of a basic word corresponding to the bitmap.

The basic word is a word registered in the static dictionary C2. The character string length is a character string length corresponding to the basic word. The appearance frequency is an appearance frequency of the basic word. The code length is a code length of the compression code. The compression code is a compression code assigned to the basic word.

FIG. 8 is a view illustrating an example of a data structure of the nodeless tree for decompression. As illustrated in FIG. 8, a nodeless tree 60 for decompression has a plurality of branches 60-1 to 60-$n$ and leaves 61-1 to 61-$m$. A predetermined bit string is assigned to each of the branches 60-1 to 60-$n$. The information processing apparatus 100 compares the bit string of the compressed data and the bit strings assigned to the branches 60-1 to 60-$n$ and specifies a leaf connected to the branch that hits the bit string of the compressed data. The leaf stores therein information of the character string corresponding to the compressed data.

For example, the data structure of the leaf is as indicated by a reference numeral 61. For example, the leaf stores therein leaf identification information, a compression code length, and a character code or a pointer to a basic word. The leaf identification information is information uniquely identifying the leaf. The compression code length is information indicating an effective length of the bit string of the compressed data that has been compared with the bit strings of the branches 60-1 to 60-$n$. The character code or the pointer to the basic word is information uniquely indicating the decompressed data when the compression code is decompressed.

For example, it is assumed that a bit string "010111110111101" hits the branch 60-4, the compression code length of the leaf 61-4 connected to the branch 60-4 is "11", and the basic word as indicated by the pointer to the basic word is "talksΔ". In this case, a bit string "01011111011" from the head to an $11^{th}$ bit of the above-mentioned bit string is the compression code corresponding to the basic word "talksΔ".

Figure 9:
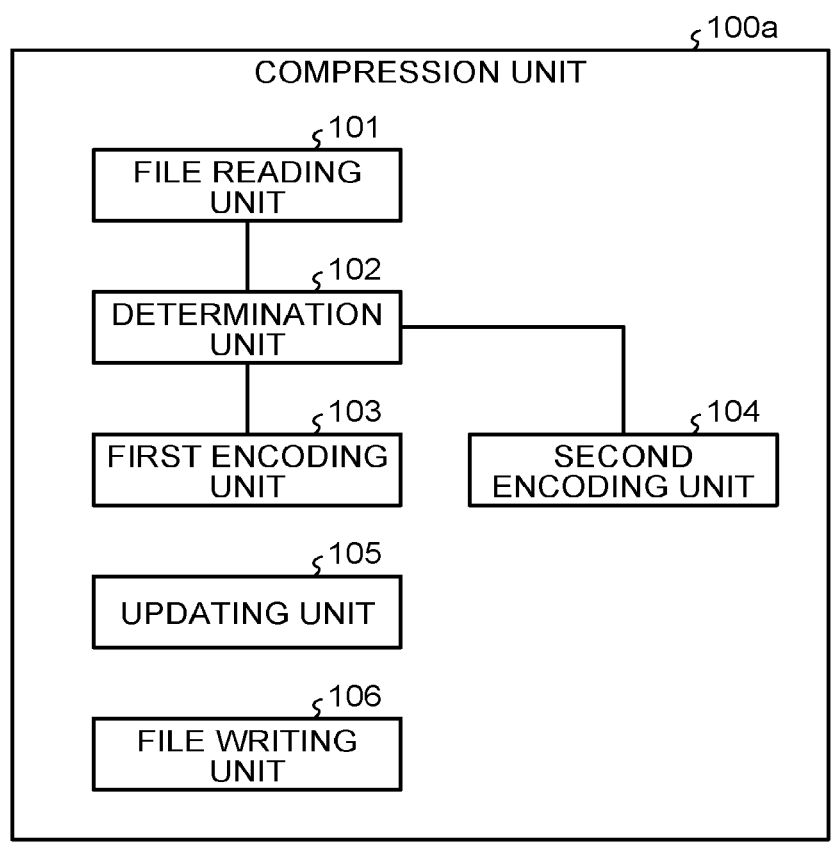
FIG. 9 is a functional block diagram illustrating an example of the configuration of a compression unit in the embodiment.

FIG. 9 is a functional block diagram illustrating an example of the configuration of the compression unit in the embodiment. As illustrated in FIG. 9, the compression unit 100a includes a file reading unit 101, a determination unit 102, a first encoding unit 103, a second encoding unit 104, an updating unit 105, and a file writing unit 106.

The file reading unit 105 is a processor that reads data of a content part in the file F1. The file reading unit 105 scans the character string contained in the read data from the head, sequentially extracts the character strings delimited by the terminal symbols, and sequentially outputs the extracted character strings to the determination unit 102.

For example, when the character string of the words of the content part in the file F1 is "KataokaΔtalksΔaboutΔ . . . ", the file reading unit 105 outputs, to the determination unit 102, the character strings "KataokaΔ", "talksΔ", "aboutΔ", and the like of the respective words in this order.

The determination unit 102 is a processor that compares the character string and the bit filter C1 and determines whether the character string hits the bit filter C1. When the character string hits the bit filter C1, the determination unit 102 outputs the character string to the first encoding unit 103. When the character string does not hit the bit filter C1, the determination unit 102 outputs the character string to the second encoding unit 104.

The processing by the determination unit 102 is described with reference to FIG. 7. It is assumed that the character string of the word that is a determination target is "talkΔ". The determination unit 102 compares the character string with the 2-grams of the bit filter C1 every 2-gram from the head of the character string and specifies the bitmap. For example, when the character string of the word is "talkΔ", the determination unit 102 combines bitmaps corresponding to "ta", "al", "lk", and "kΔ". When all values of each bitmap in digits thereof are "0", the determination unit 102 sets a corresponding digit of a combined bitmap to "0". By contrast, when the values of the bitmap contains at least one "1", the determination unit 102 sets a corresponding digit of the combined bitmap to "1". The bitmaps are thus combined.

For example, it is assumed that the bitmap of "ta" is "0_0_0_0_0", the bitmap of "al" is "0_1_0_0_0", the bitmap of "lk" is "0_0_1_0_0", and the bitmap of "kΔ" is "0_1_1_0_0". In this case, a bitmap provided by combining these bitmaps is "0_1_1_0_0".

The determination unit 102 compares the combined bitmap and the pointer of the bit filter C1 and specifies the basic word at a position as indicated by the pointer corresponding to the bitmap. The determination unit 102 searches for the basic word corresponding to the character string in the order from the specified basic word. When the basic word corresponding to the character string is present, the determination unit 102 determines that the character string hits the bit filter C1. On the other hand, when the basic word corresponding to the character string is not present, the determination unit 102 determines that the character string does not hit the bit filter C1.

The first encoding unit 103 is a processor that encodes the character string acquired from the determination unit 102 based on the static dictionary C2. The first encoding unit 103 refers to the static dictionary C2 and specifies a basic word corresponding to the character string from the static dictionary C2 and specifies a compression code corresponding to the specified basic word. Then, the first encoding unit 103 generates compressed data containing the identifier "0" and the compression code of the character string that is registered in the static dictionary C2 and outputs the compressed data to the file writing unit 106.

The second encoding unit 104 is a processor that encodes the character string of the word acquired from the determination unit 102 based on the dynamic dictionary. The second encoding unit 104 stores the character string of the word in the storage region A1 serving as the encoding portion. The second encoding unit 104 compares the character string in the storage region A1 and pieces of data stored in the storage region A2 serving as the reference portion and searches for a matching word.

When the length of the matching word is equal to or larger than the predetermined length Lmin, the second encoding unit 104 registers the matching word in the storage region A3 of the dynamic dictionary portion. The second encoding unit 104 generates a compression code based on registered contents in the dynamic dictionary portion. That is to say, the second encoding unit 104 specifies the registration number of the matching word registered in the dynamic dictionary portion as the compression code of the character string of the word. The second encoding unit 104 generates compressed data containing the identifier "1" and the registration number in the dynamic dictionary and outputs the compressed data to the file writing unit 106.

For example, when the character string "KataokaΔ" of the word is the matching word registered second in the storage region A3, the second encoding unit 104 registers "00000001" for the registration number in the reference table T1 as the registration number corresponding to the matching word "KataokaΔ". The second encoding unit 104 registers "000000000101" for the storage position because the head character "K" of the matching word "KataokaΔ" is stored at "5" in the storage region A3. The second encoding unit 104 registers "10000" for the data length because the data length of the matching word "KataokaΔ" is "8".

As illustrated in FIG. 2, when the matching word "KataokaΔ" is assumed to be registered in the dynamic dictionary portion, the second encoding unit 104 sets the registration number of the matching word "KataokaΔ" to "00000001". In this case, the second encoding unit 104 sets the compression code of the character string "KataokaΔ" of the word to "00000001". The second encoding unit 104 generates the compressed data containing the identifier "1" and the registration number "00000001" as the compressed data of the character string "KataokaΔ" of the word and outputs the compressed data to the file writing unit 106.

On the other hand, when the length of the matching word is smaller than the predetermined length Lmin, the second encoding unit 104 encodes the individual characters of the character string of the word based on the static dictionary C2. For example, when the length of the matching word corresponding to the character string "KataokaΔ" of the word is smaller than the length Lmin, the second encoding unit 104 encodes each of "K", "a", "t", "a", "o", "k", "a", and "Δ" based on the static dictionary, so as to generate the compressed data as illustrated in FIG. 3.

When a character string of a word identical to the character string of the word that is the encoding target has been already registered in the storage region A3, the second encoding unit 104 specifies the registration number of the character string of the word that has been already registered as the compression code of the character string of the word. For example, the second encoding unit 104 compares the character string of the word that is the encoding target and the character strings of the words in the storage region A3. When the character string identical to the character string of the word that is the encoding target has not been registered in the storage region A3, the second encoding unit 104 performs the above-mentioned matching word search.

The updating unit 105 is a processor that updates the storage region A2 by storing, in the storage region A2, the character string stored in the storage region A1 after the search for the matching word by the second encoding unit 104 is completed. The updating unit 105 updates the storage region A2 every time the search for the matching word by the second encoding unit 104 is completed.

The file writing unit 106 is a processor that acquires the pieces of compressed data from the first encoding unit 103 and the second encoding unit 104 and writes the acquired pieces of compressed data into the storage region A4.

Figure 10:
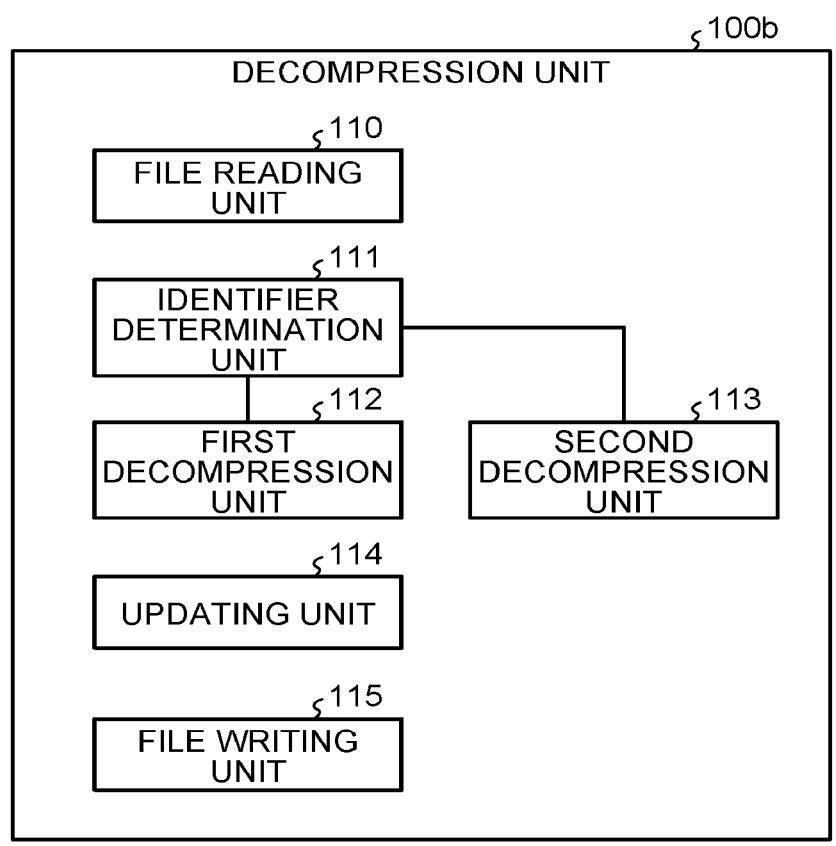
FIG. 10 is a functional block diagram illustrating an example of the configuration of a decompression unit in the embodiment.

FIG. 10 is a functional block diagram illustrating an example of the configuration of the decompression unit in the embodiment. As illustrated in FIG. 10, the decompression unit 100b includes a file reading unit 110, an identifier determination unit 111, a first decompression unit, a second decompression unit 113, an updating unit 114 and a file writing unit 115.

The file reading unit 110 is a processor that reads the compressed data in the compressed file F2 on the storage region B1. When processing on the compressed data stored in the storage region B1 is finished, the file reading unit 110 reads new compressed data from the compressed file F2 and updates the compressed data stored in the storage region B1.

The file reading unit 110 reads the information of the dynamic dictionary portion stored in the trailer portion of the compressed file F2 and stores the information in the storage region B2.

The identifier determination unit 111 is a processor that reads the identifier of the compressed data stored in the storage region B1 and determines whether the identifier is "0" or "1". The identifier corresponds to a head bit of the compressed data. The identifier of "0" indicates that the compressed data has been encoded based on the static dictionary. The identifier of "1" indicates that the compressed data has been encoded based on the dynamic dictionary.

When the identifier of the compressed data is "0", the identifier determination unit 111 outputs the compressed data to a first decompression unit 112. When the identifier of the compressed data is "1", the identifier determination unit 111 outputs the compressed data to the second decompression unit 113.

The first decompression unit 112 is a processor that decompresses the compressed data using the nodeless tree 60 for decompression. The data structure of the nodeless tree 60 for decompression corresponds to that as illustrated in FIG. 8. The first decompression unit 112 compares the bit strings assigned to the branches of the nodeless tree 60 and the compressed data excluding the identifier and specifies a leaf corresponding to the branch having the bit string identical to the compressed data. The first decompression unit 112 refers to the specified leaf and generates the character string as indicated by the pointer of the basic word that is the decompressed data of the compressed data and outputs the generated decompressed data to the file writing unit 115.

Regarding the decompression unit 112, in FIG. 8, for example, it is assumed that the bit string "010111110111101" hits the branch 60-4 of the nodeless tree 60, the compression code of the leaf 61-4 connected to the branch 60-4 is "11", and the basic word as indicated by the pointer to the basic word is "talksΔ". In this case, the decompression unit 112 generates "talksΔ" as the decompressed data corresponding to the bit string "01011111011" from the head to the $11^{th}$ bit in the bit string of the compressed data.

The second decompression unit 113 is a processor that decompresses the compressed data using the information of the dynamic dictionary portion that has been stored in the storage region B2. The second decompression unit 113 excludes the identifier from the compressed data, so as to acquire the registration number in the dynamic dictionary portion. The second decompression unit 113 compares the acquired registration number and the reference table T1 and specifies the storage position and the data length of the decompressed data that are stored in the storage region B2. The second decompression unit 113 acquires the character string of the word corresponding to the storage position and the data length from the storage region B2 and generates the acquired character string of the word as the decompressed data.

For example, processing by the second decompression unit 113 with the registration number acquired from the compressed data as "00000001" is described. The second decompression unit 113 compares the registration number "00000001" and the reference table T1 and acquires the storage position "000000000101" and the data length "1000". The second decompression unit 113 refers to the storage region B2 and acquires the character string "KataokaΔ" of the word the head of which is stored at the storage position "000000000101" and the data length of which is "1000". The second decompression unit 113 sets the acquired character string "KataokaΔ" of the word to the decompressed data and outputs the decompressed data to the file writing unit 115.

The updating unit 114 is a processor that updates the storage region B1 in which the compressed data is stored. When the identifier of the compressed data is "0", the updating unit 114 deletes, from the storage region B1, the identifier and the bit string corresponding to the compression code length of the compressed data read by the first decompression unit 112. When the identifier of the compressed data is "1", the updating unit 114 deletes, from the storage region B1, the compressed data read by the second decompression unit 113.

The file writing unit 115 is a processor that acquires the pieces of decompressed data from the first decompression unit 112 and the second decompression unit 113 and writes the acquired pieces of decompressed data into the storage region B3.

Next, processing procedures of the compression unit 100a and the decompression unit 100b as illustrated in FIG. 9 and FIG. 10, respectively, will be described.

Figure 11:
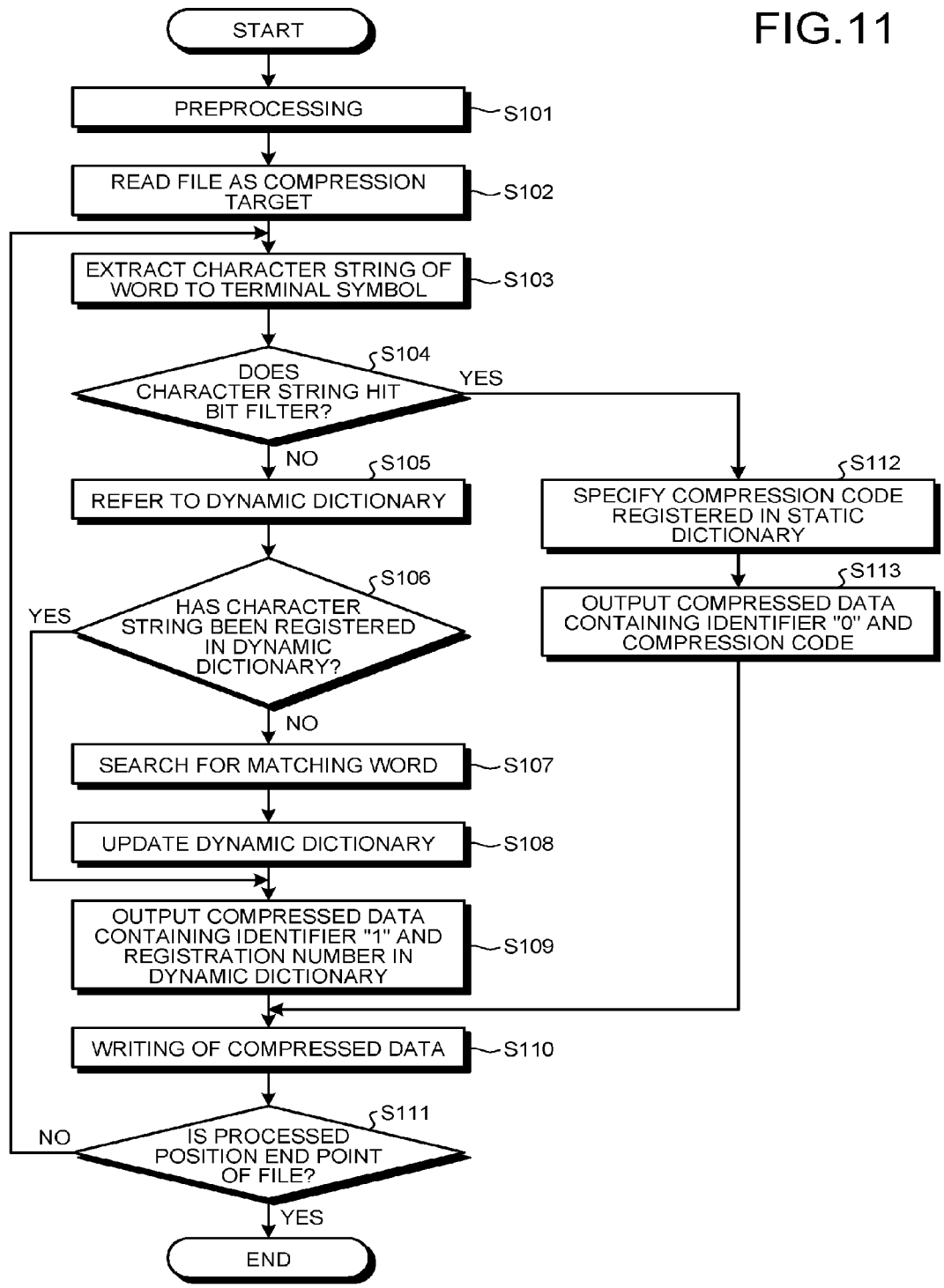
FIG. 11 is a flowchart illustrating processing procedures of the compression unit in the embodiment.

FIG. 11 is a flowchart illustrating the processing procedures of the compression unit in the embodiment. As illustrated in FIG. 11, the compression unit 100a executes preprocessing (step S101). In the preprocessing at step S101, the compression unit 100a ensures the storage region A1, the storage region A2, and the storage region A3 in the storage unit 100c.

The compression unit 100a reads the file F1 that is the compression target (step S102), and extracts, as the word, the character string to the terminal symbol (step S103). The compression unit 100a compares the character string and the bit filter C1 and determines whether the character string hits the bit filter C1 (step S104).

When the character string does not hit the bit filter C1 (No at step S104), the compression unit 100a refers to the dynamic dictionary (step S105) and determines whether the character string has been already registered in the dynamic dictionary (step S106). When the character string has been registered in the dynamic dictionary (Yes at step S106), the compression unit 100a advances the process to step S109.

On the other hand, when the character string has not been registered in the dynamic dictionary (No at step S106), the compression unit 100a executes search for a matching word (step S107). The compression unit 100a updates the dynamic dictionary (step S108).

The compression unit 100a outputs compressed data containing the identifier "1" and the registration number in the dynamic dictionary (step S109). The compression unit 100a performs writing of the compressed data (step S110) and determines whether the processed position is an end point of the file F1 (step S111). When the processed position is not the end point of the file F1 (No at step S111), the compression unit 100a returns the process to step S103. When the processed position is the end point of the file F2 (Yes at S111), the compression unit 100a finishes the processing.

When the character string hits the bit filter C1 at step S104 (Yes at S104), the compression unit 100a specifies a compression code registered in the static dictionary C2 (step S112). The compression unit 100a outputs compressed data containing the identifier "0" and the compression code (step S113), and it returns the process to step S110.

Figure 12:
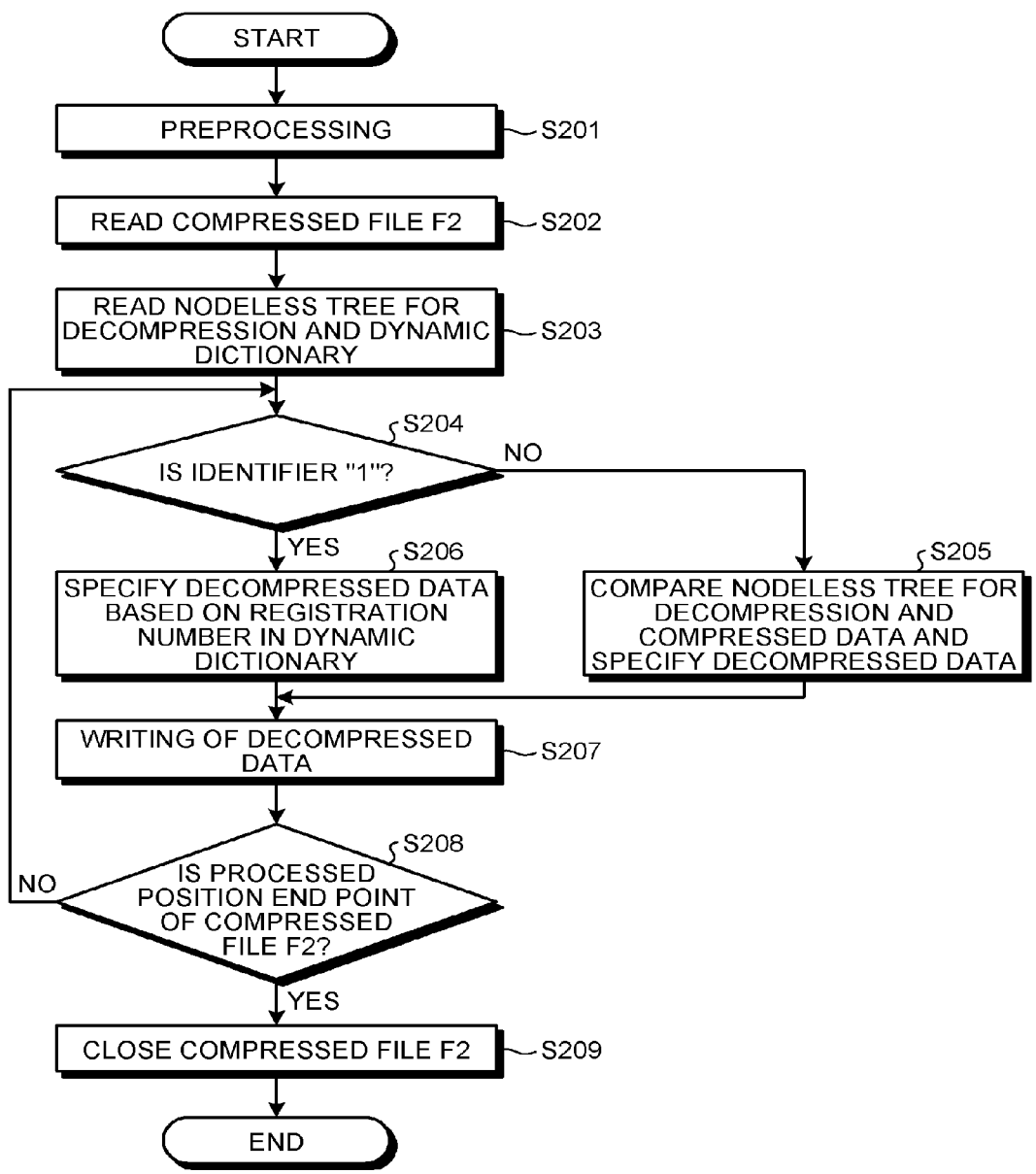
FIG. 12 is a flowchart illustrating processing procedures of the decompression unit in the embodiment.

FIG. 12 is a flowchart illustrating the processing procedures of the decompression unit in the embodiment. As illustrated in FIG. 12, the decompression unit 100b executes preprocessing (step S201). In the preprocessing at step S201, the decompression unit 100b ensures the storage region B1, the storage region B2, and the storage region B3 in the storage unit 100c.

The decompression unit 100b reads the compressed file F2 (step S202), and reads the nodeless tree 60 for decompression and the dynamic dictionary (step S203). For example, the decompression unit 100b stores, in the storage region B2, information related to the dynamic dictionary that has been stored in the trailer portion.

The decompression unit 100b determines whether the identifier of the compressed data is "1" (step S204). When the identifier is "0" (No at step S204), the decompression unit 100b compares the nodeless tree 60 for decompression and the compressed data and specifies the decompressed data (step S205). Then, it advances the process to step S207.

When the identifier of the compressed data is "1" (Yes at step S204), the decompression unit 100b specifies the decompressed data based on the registration number in the dynamic dictionary (step S206). The decompression unit 100b performs writing of the decompressed data into the storage region B3 (step S207).

The decompression unit 100b determines whether the processed position is an end point of the compressed file F2 (step S208). When the processed position is not the end point of the compressed file F2 (No at step S208), the decompression unit 100b returns the process to step S204. When the processed position is the end point of the compressed file F2 (Yes at step S208), the decompression unit 100b closes the compressed file F2 (step S209).

Next, effects by the information processing apparatus 100 in the embodiment will be described. When the information processing apparatus 100 compresses the character string that is the compression target using the static dictionary C2, it determines whether the character string that is the compression target is registered in the static dictionary using the bit filter C1. When the information processing apparatus 100 detects the character string that is not registered in the static dictionary, it registers the detected character string in the dynamic dictionary and sets the registration number in the dynamic dictionary to the compression code. The information processing apparatus 100 can therefore compress the character string that is not present in the static dictionary as the registration number in the dynamic dictionary and prevent variation of the compression rate. Furthermore, the data length of the compressed data can be prevented from increasing.

The information processing apparatus 100 in the embodiment searches for a word matching with the character string that is not registered in the bit filter C1. When the length of the matching word is equal to or larger than the predetermined length, the information processing apparatus 100 registers the matching word in the dynamic dictionary and compresses the matching word as the registration number. Accordingly, the data length of the compression code for the matching word can be reduced.

The information processing apparatus 100 in the embodiment searches for a word matching with the character string that is not registered in the bit filter C1. When the length of the matching word is smaller than the predetermined length, the information processing apparatus 100 compresses individual characters of the character string of the matching word using the static dictionary. This processing can prevent an information amount of the dynamic dictionary from increasing.

Furthermore, the information processing apparatus 100 in the embodiment decompresses the compression code based on the tree for decompression and the compression code when the identifier of the compression code is "0". When the identifier of the compression code is "1", the information processing apparatus 100 in the embodiment decompresses the compression code based on the dynamic dictionary portion and the compression code. The information processing apparatus 100 in the embodiment can therefore prevent the data length of the compressed data from increasing and decompress the compressed data accurately.

Figure 13:
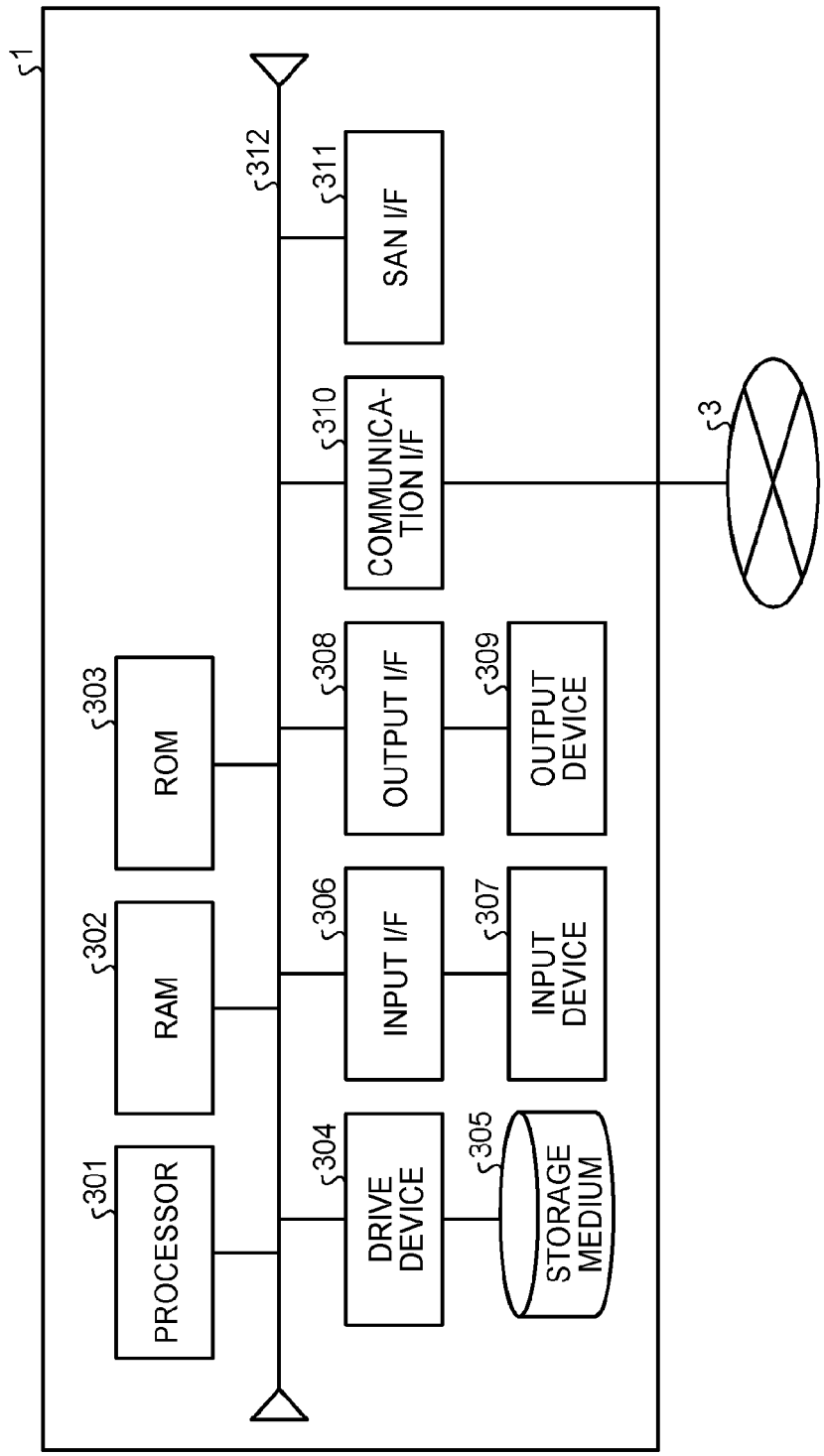
FIG. 13 is a diagram illustrating an example of the hardware configuration of a computer.

The following describes hardware and software that are used in the embodiment. FIG. 13 is a diagram illustrating an example of the hardware configuration of a computer 1. The computer 1 includes a processor 301, a random access memory (RAM) 302, a read only memory (ROM) 303, a drive device 304, a storage medium 305, an input interface (I/F) 306, an input device 307, an output interface (I/F) 308, an output device 309, a communication interface (I/F) 310, a storage area network (SAN) interface (I/F) 311, and a bus 312, for example. These pieces of hardware are connected with the bus 312.

The RAM 302 is a readable and writable memory device. For example, a semiconductor memory such as a static RAM (SRAM) and a dynamic RAM (DRAM), or a flash memory that is not the RAM can be used therefor. The ROM 303 also includes a programmable ROM (PROM). The drive device 304 is a device that performs at least one of reading and writing of information recorded in the storage medium 305. The storage medium 305 stores therein the information written by the drive device 304. The storage medium 305 is a storage medium such as a hard disc, a flash memory like a solid state drive (SSD), a compact disc (CD), a digital versatile disc (DVD), and a Blue-ray disc. For example, the computer 1 includes the drive device 304 and the storage medium 305 for each of the storage media of a plurality of types.

The input interface 306 is a circuit that is connected to the input device 307 and transmits the input signal received from the input device 307 to the processor 301. The output interface 308 is a circuit that is connected to the output device 309 and causes the output device 309 to execute output in accordance with a direction from the processor 301. The communication interface 310 is a circuit that performs control of communication through a network 3. The communication interface 310 is a network interface card (NIC), for example. The SAN interface 311 is a circuit that performs control of communication with a storage device connected to the computer 1 through a storage area network. The SAN interface 311 is a host bus adapter (HBA), for example.

The input device 307 is a device that transmits an input signal in accordance with an operation. The input device is a keyboard, a key device such as buttons attached to a main body of the computer 1, or a pointing device such as a mouse and a touch panel, for example. The output device 309 is a device that outputs information in accordance with control by the computer 1. For example, the output device 309 is an image output device (display device) such as a display or an audio output device such as a speaker. For example, an input/output device such as a touch screen is used as the input device 307 and the output device 309. The input device 307 and the output device 309 may be integrated with the computer 1 or may be devices that are not included in the computer 1 and are connected to the computer 1 externally, for example.

For example, the processor 301 reads a program stored in the ROM 303 or the storage medium 305 on the RAM 302, and performs the processing of the compression unit 100a or the processing of the decompression unit 100b in accordance with procedures of the read program. In this case, the RAM 302 is used as a work area of the processor 301. The ROM 303 and the storage medium 305 stores program files (an application program 24, middleware 23, an OS 22, and the like as will be described later) and data files (the file F1 that is the compression target, the compressed file F2, and the like) and the RAM 302 is used as the work area of the processor 301, so that the functions of the storage unit 100c are made to operate. The programs that are read by the processor 301 are described with reference to FIG. 14.

Figure 14:
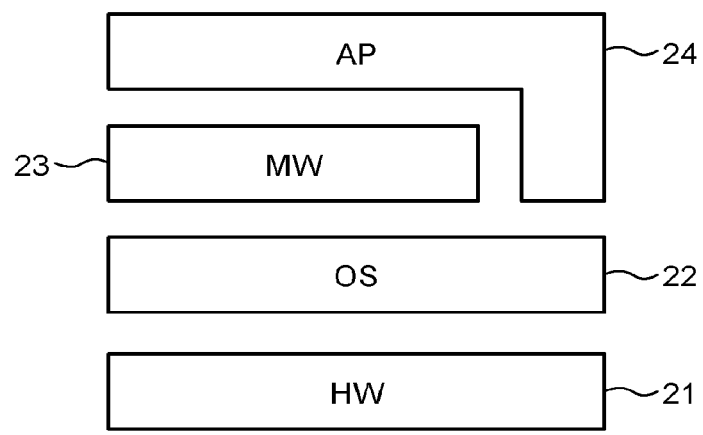
FIG. 14 is a diagram illustrating an example of the configuration of programs operating in the computer.

FIG. 14 is a diagram illustrating an example of the configuration of the programs operating in the computer 1. In the computer 1, the operating system (OS) 22 that performs control of a hardware group 21 (301 to 312) as illustrated in FIG. 13 operates. The processor 301 operates with procedures in accordance with the OS 22, so as to perform control and management of the hardware group 21. The control and management cause a process in accordance with the application program 24 and the middleware 23 to be executed by the hardware group 21. Furthermore, in the computer 1, the middleware 23 or the application program 24 is read on the RAM 302 and is executed by the processor 301.

When a compression function is called, the processor 301 performs a process based on at least a part of the middleware 23 or the application program 24, so that the functions of the compression unit 100a are implemented (with the process performed by controlling the hardware group 21 based on the OS 22). Furthermore, when the decompression function is called, the processor 301 performs a process based on at least a part of the middleware 23 or the application program 24, so that the functions of the decompression unit 100b are implemented (with the process performed by controlling the hardware group 21 based on the OS 22). The compression function and the decompression function may be incorporated in the application program 24 itself or may be a part of the middleware 23 that is executed by being called in accordance with the application program 24.

The compressed file F2 provided by the compression function of the application program 24 (or the middleware 23) can be partially decompressed based on a compressed dictionary Dl in the compressed file F2. When the middle of the compressed file F2 is decompressed, the decompression processing on the compressed data to a portion of a decompression target is inhibited and load on the processor 301 is therefore reduced. Furthermore, the compressed data that is a decompression target is partially developed on the RAM 302, thereby reducing the work area.

Figure 15:
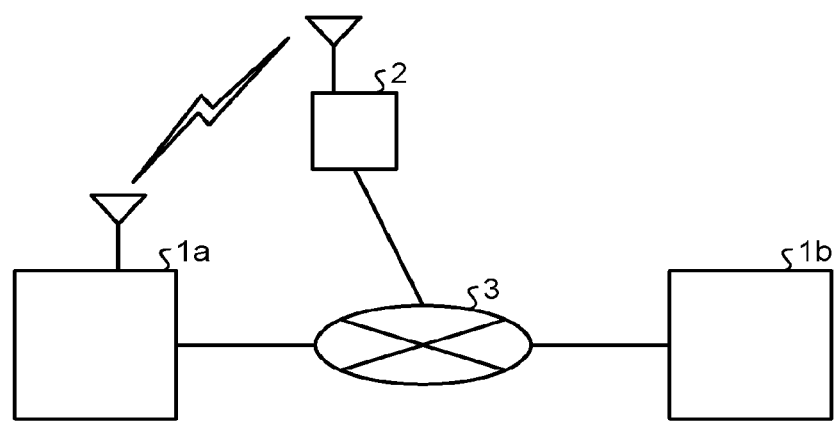
FIG. 15 is a view illustrating an example of the configuration of apparatuses in a system according to another embodiment.

FIG. 15 is a view illustrating an example of the configuration of apparatuses in a system according to another embodiment. The system in FIG. 15 includes a computer 1a, a computer 1b, a base station 2, and the network 3. The computer 1a is connected to the network 3 connected to the computer 1b at least in a wireless or wired manner.

Any of the computer 1a and the computer 1b as illustrated in FIG. 15 may include the compression unit 100a and the decompression unit 100b as illustrated in FIG. 6. The computer 1a may include the compression unit 100a and the computer 1b may include the decompression unit 100b. Alternatively, the computer 1b may include the compression unit 100a and the computer 1a may include the decompression unit 100b. Both of the computer 1a and the computer 1b may include the compression unit 100a and the decompression unit 100b.

Hereinafter, a part of modifications of the above-mentioned embodiment will be described. Not only the following modifications but also design changes in a range without departing from the scope of the invention can be made appropriately. The compression processing target may be a monitoring message that is output from the system in addition to the data in the file. For example, processing of compressing the monitoring messages that are sequentially stored in a buffer by the above-mentioned compression processing and storing the compressed monitoring messages as a log file is performed. For example, compression based on a page in a database may be performed or compression based on a plurality of pages collectively may be performed.

Figure 16:
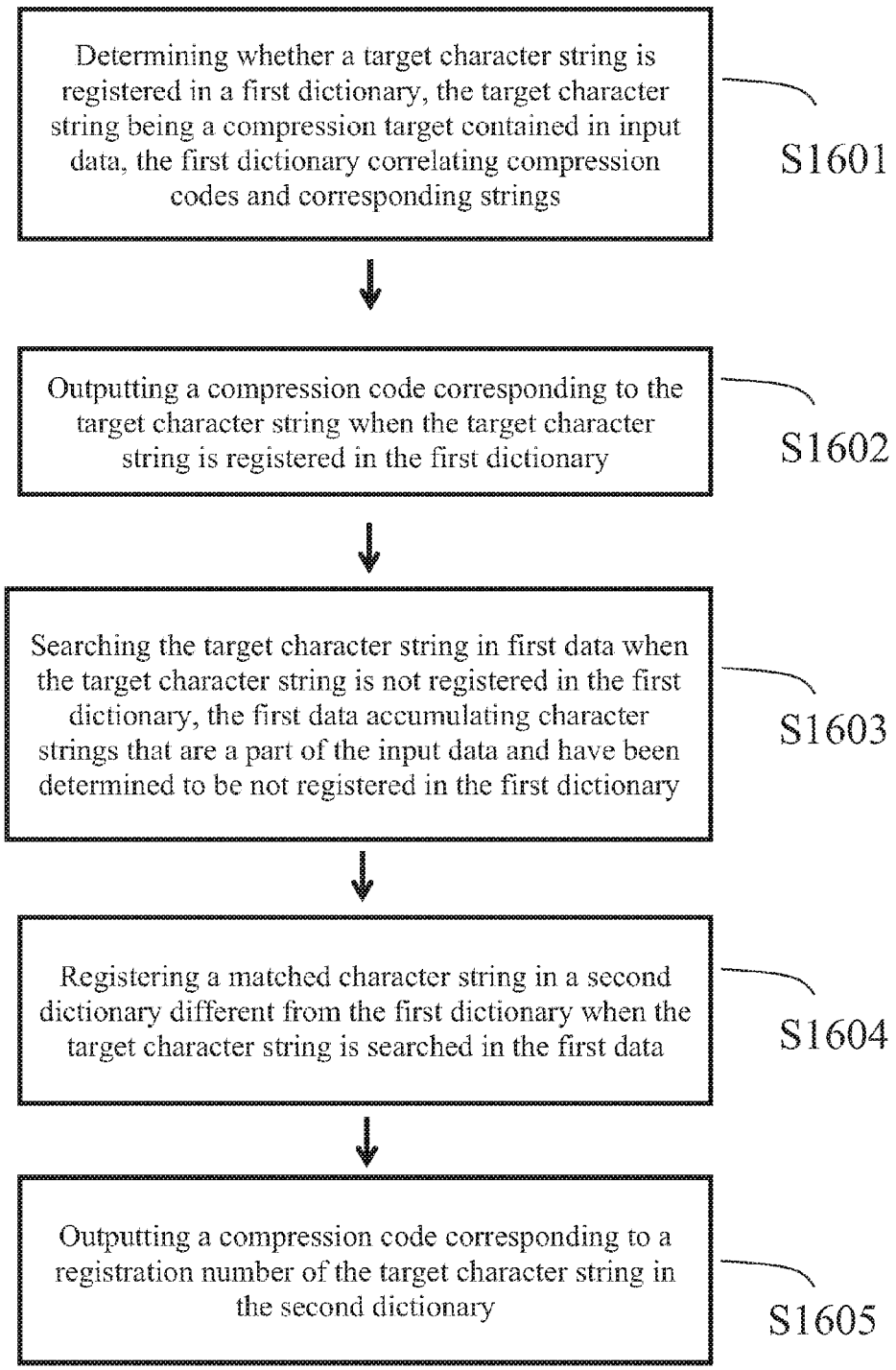
FIG. 16 is a flowchart illustrating processing procedures according to an embodiment.
Figure 17:
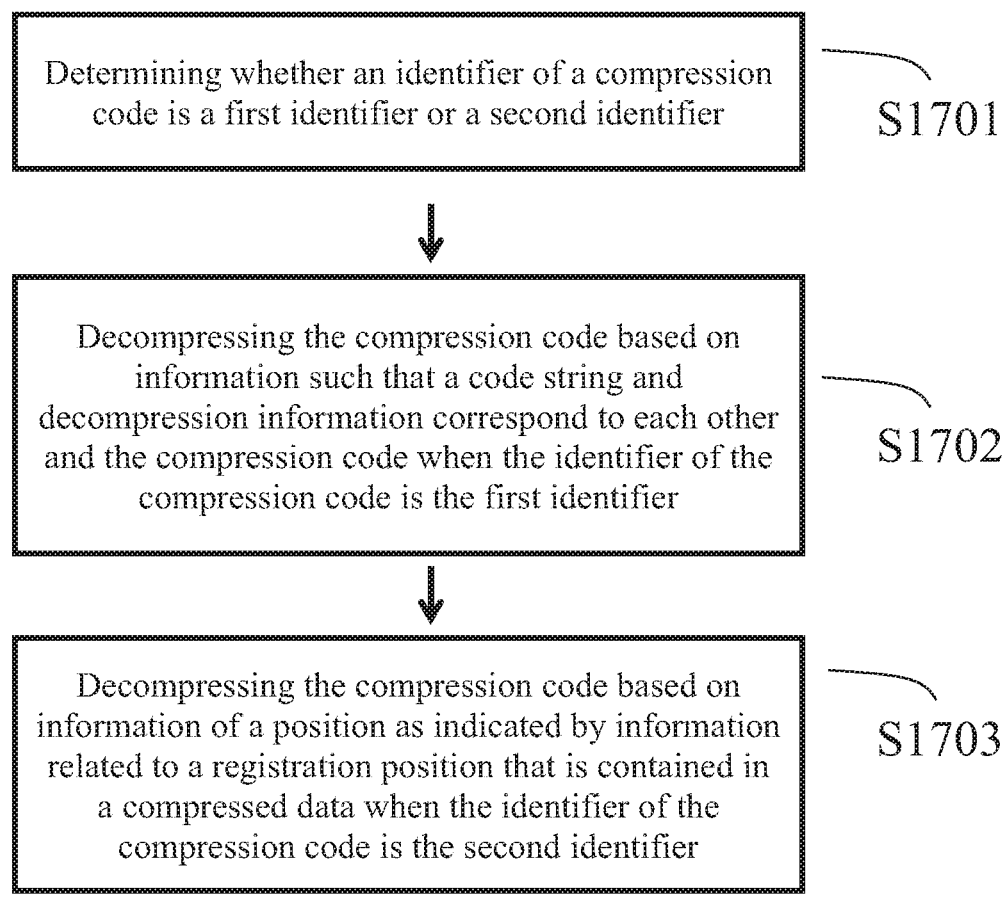
FIG. 17 is a flowchart illustrating processing procedures according to an embodiment.

Furthermore, target data of the above-mentioned compression processing is not limited to character information as described above. The above-mentioned compression processing may be performed on information formed by only numerical values or data of an image or audio. For example, a file with a large amount of data that is provided by audio synthesis contains repeating contents in the data and a compression rate thereof is therefore expected to be improved by the dynamic dictionary. It is obvious that when only a part of the file is used, excess decompression processing is eliminated by partial decompression. Furthermore, images of individual frames are similar also in a moving image shot by a fixed camera and the moving image therefore contains repeating contents. The same effects as those for document data and audio data can be provided for the moving image by applying the above-mentioned compression processing thereto. Furthermore, FIG. 16 illustrates a flowchart having the steps of: determining whether a target character string is registered in a first dictionary, the target character string being a compression target contained in input data, the first dictionary correlating compression codes and corresponding strings (S1601); outputting a compression code corresponding to the target character string when the target character string is registered in the first dictionary (S1602); searching the target character string in first data when the target character string is not registered in the first dictionary, the first data accumulating character strings that are a part of the input data and have been determined to be not registered in the first dictionary (S1603); registering a matched character string in a second dictionary different from the first dictionary when the target character string is searched in the first data (S1604); and outputting a compression code corresponding to a registration number of the target character string in the second dictionary (S1605). Moreover, FIG. 17 illustrates another flowchart having the steps of: determining whether an identifier of a compression code is a first identifier or a second identifier (S1701); decompressing the compression code based on information such that a code string and decompression information correspond to each other and the compression code when the identifier of the compression code is the first identifier (S1702); and decompressing the compression code based on information of a position as indicated by information related to a registration position that is contained in a compressed data when the identifier of the compression code is the second identifier (S1703).

An embodiment of the present invention provides an effect capable of preventing lengths of compression codes corresponding to character strings of words and the like in a compressed file from increasing.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium having stored therein an encoding program that causes a computer to execute a process, the process comprising:

determining whether a target character string is registered in a first dictionary, the target character string being a compression target contained in input data, the first dictionary correlating compression codes and corresponding strings;

outputting a compression code corresponding to the target character string when the target character string is registered in the first dictionary;

searching the target character string in first data when the target character string is not registered in the first dictionary, the first data accumulating character strings that are a part of the input data and have been determined to be not registered in the first dictionary;

registering a matched character string in a second dictionary different from the first dictionary when the target character string is searched in the first data; and outputting a compression code corresponding to a registration number of the target character string in the second dictionary.

2. The non-transitory computer-readable recording medium according to claim 1, wherein the process further comprises:

performing search for a word matching with the target character string that is not registered in the first dictionary, and registering the matched word in the second dictionary when a length of the matched word is equal to or larger than a predetermined length and the outputting outputs information based on the registration number.

3. The non-transitory computer-readable recording medium according to claim 1, wherein the process further comprises:

performing search for a word matching with the target character string that is not registered in the first dictionary and outputting compression codes corresponding to individual characters of the target character string based on the first dictionary when a length of the matched word is smaller than a predetermined length.

4. A non-transitory computer-readable recording medium having stored therein a decompression program that causes a computer to execute a process, the process comprising:

determining whether an identifier of a compression code is a first identifier or a second identifier;

decompressing the compression code based on information such that a code string and decompression information correspond to each other and the compression code when the identifier of the compression code is the first identifier; and decompressing the compression code based on information of a position as indicated by information related to a registration position that is contained in a compressed data when the identifier of the compression code is the second identifier.

5. A compression method that is executed by a computer, the compression method comprising:

determining whether a target character string is registered in a first dictionary, the target character string being a compression target contained in input data, the first dictionary correlating compression codes and corresponding strings;

outputting a compression code corresponding to the target character string when the target character string is registered in the first dictionary;

searching the target character string in first data when the target character string is not registered in the first dictionary, the first data accumulating character strings that are a part of the input data and have been determined to be not registered in the first dictionary;

registering a matched character string in a second dictionary different from the first dictionary when the target character string is searched in the first data; and outputting a compression code corresponding to a registration number of the target character string in the second dictionary.

6. The compression method according to claim 5, further comprising:

performing search for a word matching with the target character string that is not registered in the first dictionary, and registering the matched word in the second dictionary when a length of the matched word is equal to or larger than a predetermined length and the outputting outputs information based on the registration number.

7. The compression method according to claim 5, further comprising:

performing search for a word matching with the target character string that is not registered in the first dictionary and outputting compression codes corresponding to individual characters of the target character string based on the first dictionary when a length of the matching word is smaller than a predetermined length.

8. A decompression method that is executed by a computer, the decompression method comprising:

determining whether an identifier of a compression code is a first identifier or a second identifier;

decompressing the compression code based on information such that a code string and decompression information correspond to each other and the compression code when the identifier of the compression code is the first identifier; and decompressing the compression code based on information of a position as indicated by information related to a registration position that is contained in a compressed data when the identifier of the compression code is the second identifier.

9. A compression device comprising:

a processor configured to:

determine whether a target character string is registered in a first dictionary, the target character string being a compression target contained in input data, the first dictionary correlating compression codes and corresponding strings;

output a compression code corresponding to the target character string when the target character string is registered in the first dictionary;

search the target character string in first data when the target character string is not registered in the first dictionary, the first data accumulating character strings that are a part of the input data and have been determined to be not registered in the first dictionary;

register a matched character string in a second dictionary different from the first dictionary when the target character string is searched in the first data; and output a compression code corresponding to a registration number of the target character string in the second dictionary.

10. The compression device according to claim 9, wherein the processor is further configured to perform search for a word matching with the target character string that is not registered in the first dictionary, register the matched word in the second dictionary when a length of the matched word is equal to or larger than a predetermined length and the output outputs information based on the registration number.

11. The compression device according to claim 9, wherein the processor is further configured to perform search for a word matching with the target character string that is not registered in the first dictionary and output compression codes corresponding to individual characters of the target character string based on the first dictionary when a length of the matched word is smaller than a predetermined length.

12. A decompression device comprising:
a processor configured to:
- determine whether an identifier of a compression code is a first identifier or a second identifier;
- decompress the compression code based on information such that a code string and decompression information correspond to each other and the compression code when the identifier of the compression code is the first identifier; and
- decompress the compression code based on information of a position as indicated by information related to a registration position that is contained in a compressed data when the identifier of the compression code is the second identifier.

* * * * *